United States Patent [19]
Kolor et al.

[11] Patent Number: 5,590,071
[45] Date of Patent: Dec. 31, 1996

[54] METHOD AND APPARATUS FOR EMULATING A HIGH CAPACITY DRAM

[75] Inventors: Daniel J. Kolor, Wappingers Falls; Nitin B. Gupte; Siddharth R. Shah, both of Hopewell Junction, all of N.Y.

[73] Assignee: International Business Machines Corporation, Armonk, N.Y.

[21] Appl. No.: 559,321

[22] Filed: Nov. 16, 1995

[51] Int. Cl.$^6$ ............................................. G11C 11/24
[52] U.S. Cl. ................ 365/149; 365/230.01; 365/230.06
[58] Field of Search ............................. 365/149, 230.01, 365/230.06

[56] References Cited

U.S. PATENT DOCUMENTS

| | | | |
|---|---|---|---|
| 4,999,815 | 3/1991 | Barth, Jr. et al. | 365/230.06 |
| 5,164,916 | 11/1992 | Wu et al. | 365/52 |
| 5,228,132 | 7/1993 | Neal et al. | 365/193 |
| 5,307,320 | 4/1994 | Farrer et al. | 365/230.01 |
| 5,371,866 | 12/1994 | Cady | 365/230.03 |

OTHER PUBLICATIONS

IBM Technical Disclosure Bulletin, vol. 30, No. 11, pp. 363–365, Apr. 1988.
IBM Engineering Specification, Spec #43G9062, "4M×4 Stacked DRAM".
"Integrated Multichip Memory Module, Structure and Fabrication", IBM Docket No. BU9–93–027.

*Primary Examiner*—David C. Nelms
*Assistant Examiner*—F. Niranjan
*Attorney, Agent, or Firm*—Marc A. Ehrlich

[57] ABSTRACT

A method and apparatus for emulating a high storage capacity DRAM component. The emulation involves the use of a component containing multiple DRAMs, each having a lower storage capacity than that of the emulated DRAM, but having a cumulative storage capacity greater than or equal to that of the DRAM being emulated. Emulation entails the decoding of extra bits in an address signal from a controller for the high capacity DRAM to direct the output of DRAM control signals from a decoder to the multiple DRAM component so as to activate only one of the plurality of lower density DRAMs therein. Advantageously, the invention may be implemented so as to permit migration to a next generation DRAM device without altering wiring on the printed circuit board or changing the memory controller used to access the DRAM component.

32 Claims, 7 Drawing Sheets

METHOD AND APPARATUS FOR EMULATING A HIGH CAPACITY DRAM

FIELD OF THE INVENTION

This invention is related to digital data processing systems and particularly to digital systems utilizing DRAM and having high memory capacity requirements.

GLOSSARY OF TERMS

While dictionary meanings are also implied by certain terms used here, the following glossary of some terms may be useful.
RAS: row address strobe
CAS: column address strobe
DRAM: dynamic random access memory
LEAD FRAME: metal structure that forms leads in DRAM package
Stacked DRAM: multiple DRAMS stacked vertically and physically attached.
Mb: Megabit (1048576 bits)

REFERENCES USED IN THE DISCUSSION OF THE INVENTION

During the detailed description which follows the following works will be referenced as an aid for the reader. These additional references are:
IBM APPLICATION SPEC #43G9062 2 High/4 High Stacked Module
JEDEC 16 Mb×4 bits 400 mil definition
These additional references are incorporated by reference.

BACKGROUND OF THE INVENTION

Each new generation of DRAM technology provides a greater storage capacity than the previous generation. In order to provide enough granularity to meet a wide range of memory requirements, many digital designs incorporate multiple generations of DRAMs. The larger memories that rely on the latest generations of DRAMs become cost prohibitive until the price cross-over for the new DRAM takes place. Using multiple DRAMs to emulate the next generation DRAM is usually not feasible due to limitations on board space.

International Business Machines Corporation (hereinafter IBM) currently manufactures stacked DRAMs in a TSOJ-32 pin package as IBM part number 42G9062.

This invention facilitates the emulation of a next generation DRAM by utilizing such a component which includes a plurality of DRAMs having a cumulative memory capacity that is at least equal to the capacity of the DRAM component that is to be emulated. The invention permits the use of a common controller to access the next generation DRAM component as well as the current generation multiple DRAM component so as to facilitate migration to the next generation component when such a migration becomes economically expedient. The invention utilizes additional bits from the controller's address signal that are required to address the next generation DRAM, but are not utilized in addressing any one of the lower density DRAMs in the current generation multiple DRAM component. These additional bits are decoded to direct DRAM control signals such as RAS and CAS or WRITE and Output Enable so as to permit one of the plurality of DRAMs to be accessed. For example, the invention contemplates the steering of DRAM control signals such as RAS and CAS on to output lines from a decoder such that only one of the plurality of DRAMs in the current generation component receives both a RAS and a CAS. Thus, the addressing scheme of the next generation memory is utilized to access a memory location in one of the plurality of current generation DRAMs. The invention teaches the use of a component that has a physical footprint that is compatible with the next generation DRAM component that is being emulated, so as to further provide a means for migration to the next generation DRAM component without necessitating a redesign of the circuit board when the use of this new technology becomes economically expedient.

Recent memory designs have utilized a scheme of interleaving memory control signals between multiple discrete memory components. U.S. Pat. No. 5,228,132 issued Jul. 13, 1993 to Neal, et al. teaches a byte-addressable module for achieving output byte parity without using an individual memory device for each parity bit. This is achieved by interleaving RAS and CAS between several discrete DRAM devices on the module. Likewise, U.S. Pat. No. 5,164,916 issued Nov. 17, 1992 to Wu, et al. describes the implementation of a high density memory module including matrices of multiple discrete memory chips on both sides of a printed wiring board. The implementation teaches limited interleaving of RAS and CAS between groups of these memory chips. Both of these inventions teach interleaving control signals among multiple components rather than a single component as in the present invention, and additionally, both fail to address the problem of emulating next generation memory with a single current generation memory component to conserve card space and provide a simple migration path to the next generation memory component.

Inventions that have utilized stacked components have failed to provide adequate emulation of a next generation component. For example, U.S. Pat. No. 5,371,866 issued on Dec. 6, 1994 to Cady, et al. teaches the use of a stacked DRAM device utilizing a quad RAS decoding scheme wherein address bits from the address bus are used to access the stacked component. The invention requires that the addressing scheme for the current generation DRAMs is utilized, thus failing to emulate a next generation component. Furthermore, since a next generation component would require a new controller, the invention fails to provide a simple migration path to the higher capacity component.

SUMMARY OF THE INVENTION

The above stated problems and related problems of the prior art are solved with the principles of the present invention, the emulation of a high capacity DRAM component via a single component which includes a plurality of lower memory capacity DRAMs having a cumulative memory capacity greater than or equal to the memory capacity of the DRAM component that is being emulated.

The invention allows the emulation of the high memory capacity DRAM component using a component that utilizes the industry standard footprint for the high memory capacity DRAM component to permit migration thereto without requiring a redesign of the circuit board. Furthermore, the invention provides the ability to use the same addressing scheme for the component containing the plurality of lower memory capacity DRAMs as would be used for the high memory capacity component, thus permitting migration to the high memory capacity component using the same DRAM controller used to access the current generation component including the plural lower memory capacity DRAMs.

The invention takes advantage of the fact that an address signal for the higher capacity DRAM will contain extra bits as compared an address signal for each of the plurality of lower capacity DRAMS, these extra address bits from the memory controller are decoded by decoding logic to select one of the plurality of lower capacity DRAMs by directing DRAM control signals to the selected DRAM so as to permit access thereto. Such directed control signals could for example include RAS and CAS or Write and Output Enable.

Thus, this invention provides a means for achieving the storage capacity of a next generation DRAM component in a single current generation component while utilizing the addressing scheme of the next generation device. Depending upon the particular implementation, the emulation may be accomplished in such a manner that migration to the high density DRAM component would require few, if any, changes to the circuit board layout.

These and other improvements are set forth in the following detailed description. For a better understanding of the invention with advantages and features, refer to the description and to the drawings.

BRIEF DESCRIPTION OF THE DRAWINGS

Our detailed description explains the preferred embodiments of our invention, together with advantages and features, by way of example with reference to the following drawings.

DETAILED DESCRIPTION OF THE INVENTION

For the standard page mode DRAM, the addressing of the memory array is broken up into row and column addresses. The row and column addresses are multiplexed over the same bus, and are captured by the DRAM with the RAS and CAS lines respectively. A successive generation of DRAM typically has four times the storage capacity of the previous generation. Assuming that the number of data pins per component remains constant between generations, it is clear that two additional address bits are needed to address the $2^2$ increase in storage capacity.

In order to achieve the best price performance for a particular memory design, it is important that the design use the DRAM generation that offers the lowest cost per bit of storage. Additionally, it would be desirable for the design to easily accommodate the next generation DRAM component, so as to provide a simple and inexpensive transition into that technology when it eventually becomes the lowest cost per bit of storage design solution. However, as a result of space limitations on the circuit board, it is typically not feasible to utilize discrete current generation DRAM components as "temporary" replacements for a next generation DRAM component since approximately four times as much board space is required for the discrete devices, and extensive card redesign would be needed to migrate to the next generation device.

With the availability of components containing multiple DRAM devices having current generation storage capacities, it is now possible to achieve the same storage capacity as is available in a next generation DRAM component in a single current generation multiple DRAM component. It is possible to further enhance the usefulness of the current generation multiple DRAM component by configuring it such that:

1. Its footprint is the same physical size as the next generation DRAM.
2. Its pin assignments are compatible with the next generation DRAM's pin assignments.
3. The number of control lines available to the current generation multiple DRAM component are such that the emulation of a next generation DRAM component is possible.
4. The addressing scheme from a DRAM controller for the current generation multiple DRAM component is identical to that for a next generation DRAM such that the controller need not be altered to accommodate either component.

Figure 1:
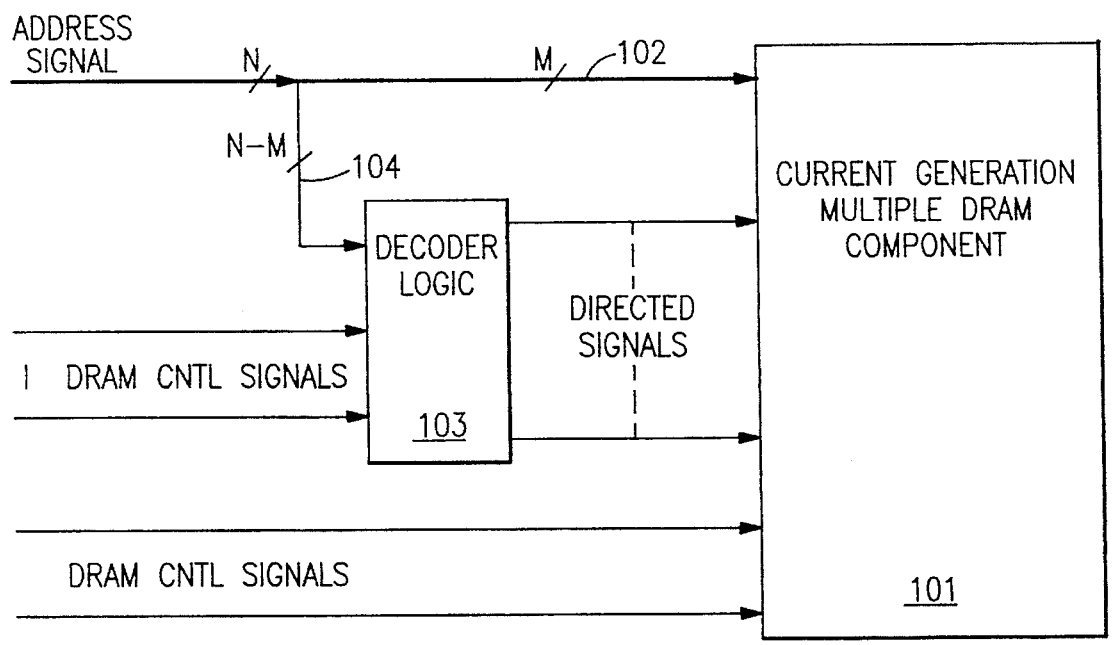
FIG. 1 shows a schematic overview of the invention.

Emulation is used here to imply that the current generation multiple DRAM component is configured so as to make it appear to a memory controller to be a next generation DRAM instead of a plurality of current generation DRAMs. As illustrated in FIG. 1, this emulation is possible due to the fact that each of the plurality of current generation DRAMs may be accessed using an address signal (102) having fewer address bits (M bits) than would be required by the next generation DRAM (N bits). The additional address bits in an address signal for a next generation DRAM that is sent to the current generation multiple DRAM component could be contained in the row address, the column address or both the row and column addresses for the next generation DRAM. These additional bits (N-M bits 104) are decoded by decoding logic so as to direct DRAM control signals to the current generation multiple DRAM component (101) in such a manner that only one of the current generation DRAMs contained therein is activated. In a preferred embodiment of the invention, these control signals are RAS and/or CAS. In such an embodiment the additional address bits are decoded to direct RAS and/or CAS in such a manner that the combination of both RAS and CAS is provided to only one of the plurality of current generation DRAMs, thereby permitting access to that particular current generation DRAM.

Figure 2:
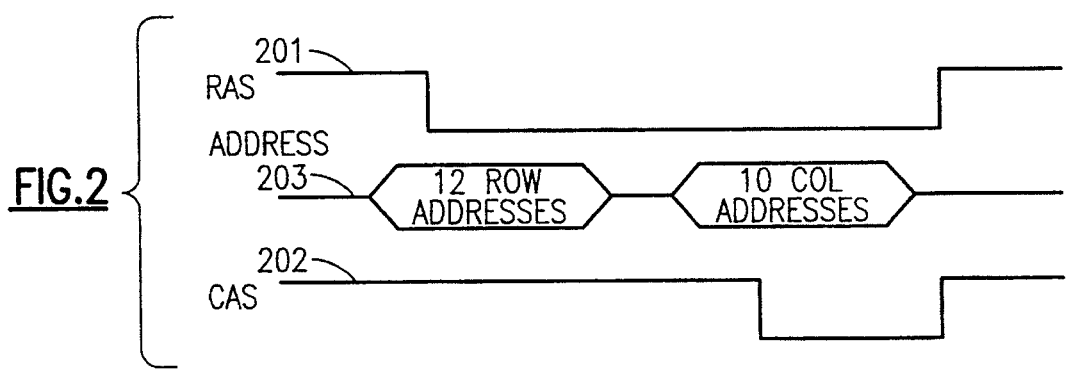
FIG. 2 shows a simplified timing diagram for a 4 Mb×4 bits 12/10 DRAM.
Figure 3:
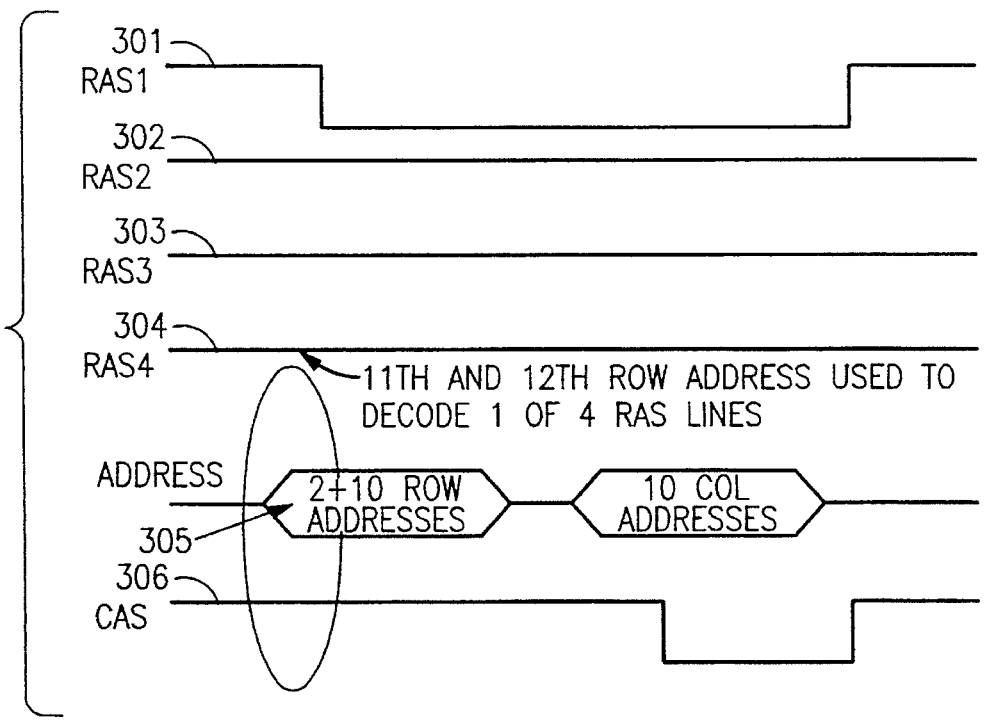
FIG. 3 shows a simple timing diagram illustrating the emulation of a 4 Mb×4 bits 12/10 DRAM with a four-high quad RAS stack of 1 Mb×4 bits 10/10 DRAMs.

A simple example of this decoding would be the emulation of a 4 Mb×4 bits DRAM with a 12/10 (i.e. 12 row address bits/10 column address bits) addressing scheme, using a component including four stacked 1 Mb×4 bits bit 10 DRAMs, with four RAS lines and one CAS line connecting to the component as pins. FIG. 2 shows a typical timing diagram for the RAS (201), CAS (203) and address lines (202) for the 4 Mb×4 bits 12/10 DRAM. FIG. 3 shows the timing for the DRAM component when substituting the stack of 1 MB×4 bits 10/10 DRAMs. There are two row address for the 4 Mb×4 bits 12/10 part that are not used by the 10/10 parts (305). These two row address bits are the additional bits that are used for decoding in FIG. 1 (103). These two additional bits from the row address signal(N-M) are decoded to direct the output of the RAS so as to provide the strobe to one of the four RAS pins which in turn each connect to one of the four DRAMs in the stacked 1 Mb×4 bits DRAM device (101), thus only one of the four 1 Mb×4 bits DRAMs will receive the RAS from the decoder. Since t single CAS line connects to each of the four DRAMs, only one of the four DRAMs will be activated by receiving both the directed RAS (301) and the CAS (306). In this manner the address signal for the higher storage capacity device may be used to access one of the four lower storage capacity DRAMs. This decoding is performed using logic (103) external to the DRAM controller responsible for generating the DRAM control signals and multiplexed address signals. Thus, the memory appears to the controller as a 4 Mb×4 bits 12/10 DRAM rather than a stack of 1 Mb×4 bits 10/10 DRAMs. Emulation of next generation technology:

1. Allows early hardware to be built before next generation DRAMs are available.
2. Facilitates an easy transition to the new technology when the price crossover for the technology occurs.
3. Allows the previous generation power supply voltage to be used.

THE PREFERRED EMBODIMENT

Figure 4:
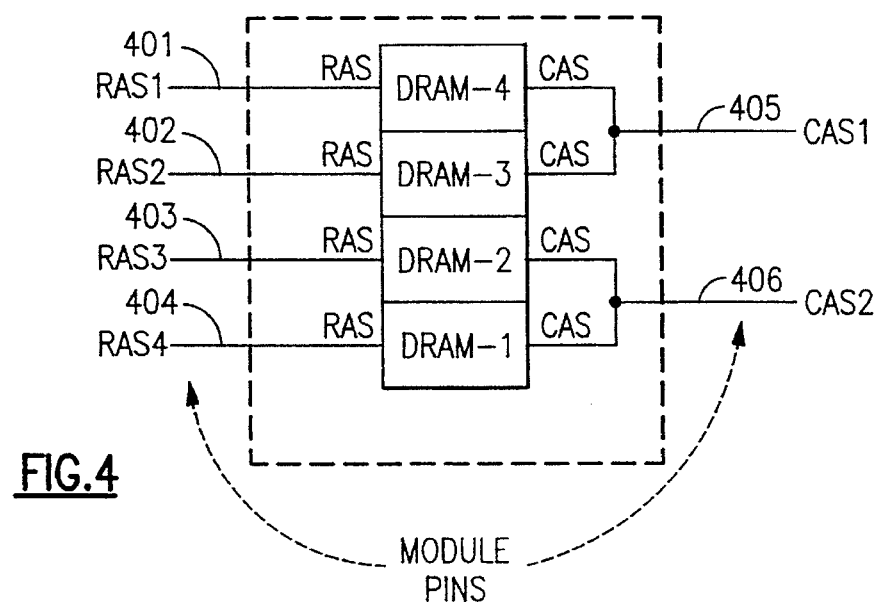
FIG. 4 illustrates the RAS and CAS connections for a quad RAS, dual CAS stacked component of 4 Mb×4 bits 11/11 DRAMs.
Figure 5:
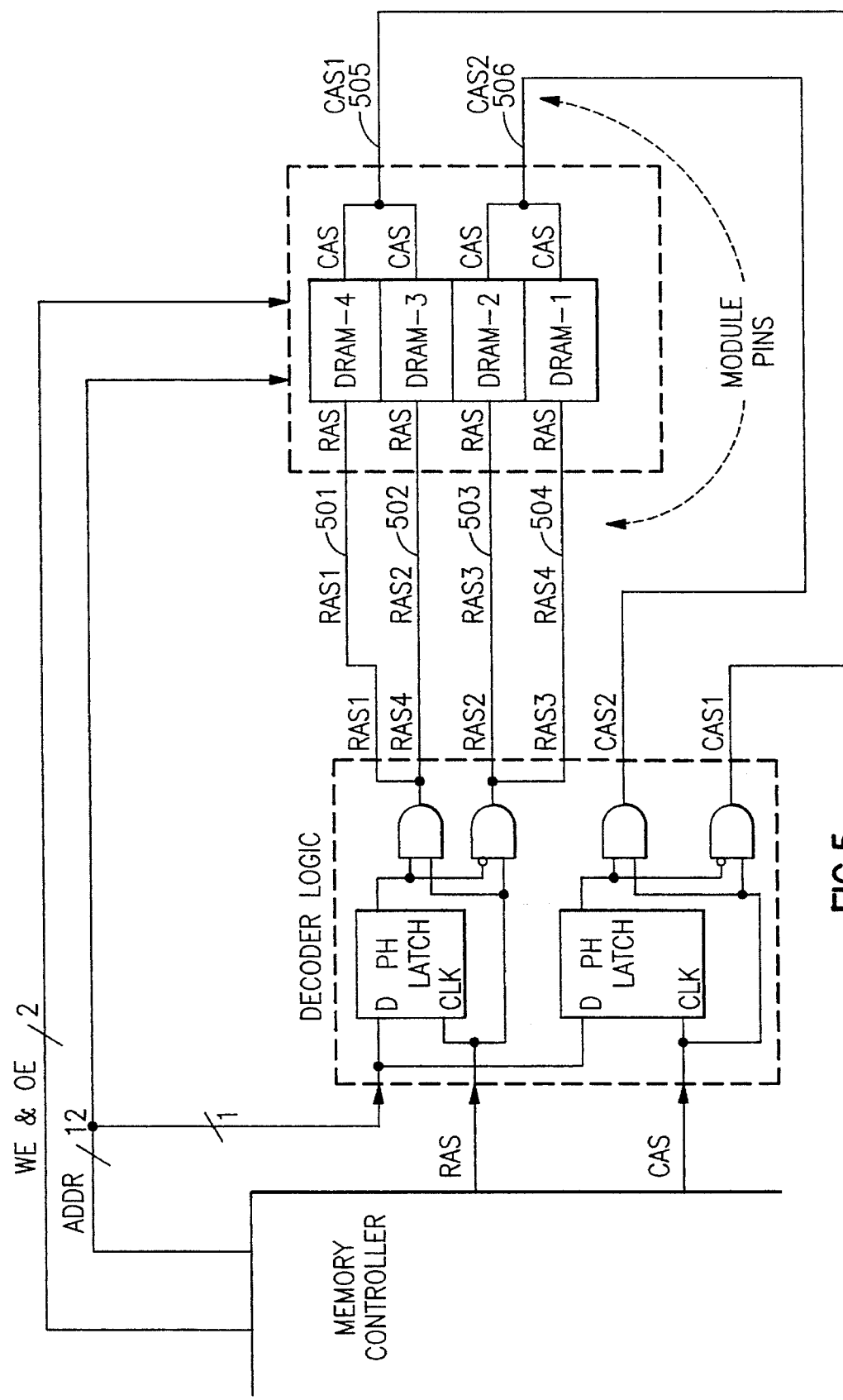
FIG. 5 illustrates the four RAS lines physically connected on the card.
Figure 6:
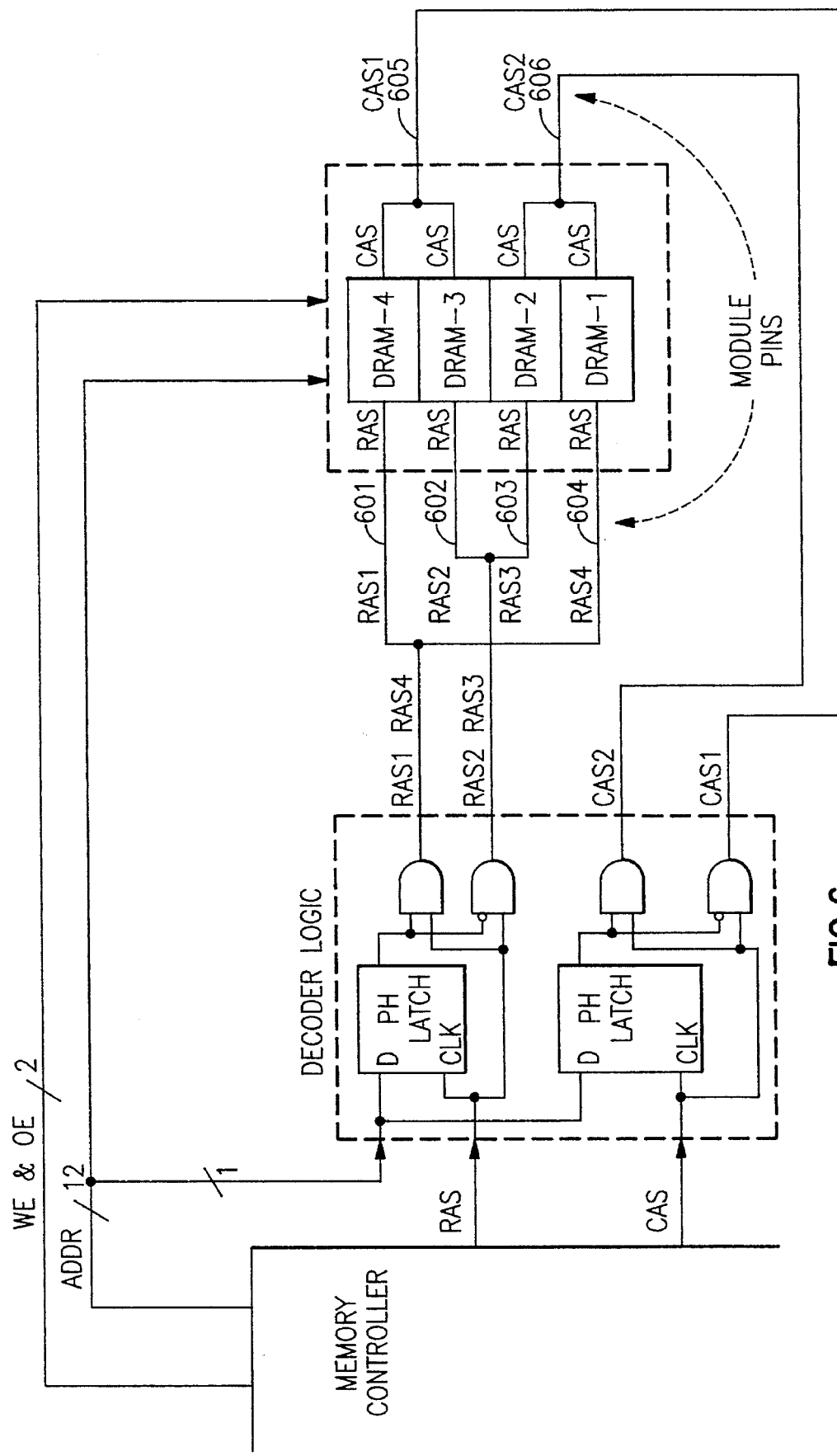
FIG. 6 illustrates the four RAS lines logically connected in the decode logic.

Turning now to our invention in greater detail, FIG. 4 illustrates the control signal connections for a stacked DRAM component which is used to emulate a 16 Mb×4 bits 12/12 DRAM component having a storage capacity of 64 Mb. The emulation is performed using a quad RAS, dual CAS, stacked component including four 4 Mb×4 bits 11/11 DRAMs. FIG. 4 details the RAS and CAS connections within the stack. The stack has four independent RAS lines (401–404) and two independent CAS lines (405 & 406) which would be accessible as pins at the package level. In a preferred embodiment one of the additional address bits that is decoded for directing the control signals to the stacked DRAM component is included in the row address for the 16 Mb×4 bits component, and the other is included in the column address. Thus, the additional row address bit is used in the decoding logic to direct the RAS signals over two of the four RAS lines that connect to the stacked DRAM component, and the additional column address bit is decoded used to direct the CAS signal over one of the two CAS lines. The four RAS lines may be physically connected on the card as in FIG. 5 or they may be logically connected within the decode logic as in FIG. 6. Each RAS line connects to a different DRAM within the stacked component. The RAS connections permit the decoder to direct the RAS to two of the four DRAMS, and the RAS connections are configured to minimize the maximum delta I noise that results from the simultaneous access of two DRAMs within the stack as is shown in FIG. 5.

The CAS lines are connected within the component such that each CAS pin on the device connects to two DRAMs within the stack. The CAS connections are made relative to the aforementioned RAS connections such that no two DRAMs within the stack receive the same CAS and RAS as directed from the decoding logic as is illustrated in FIG. 5.

Figure 7:
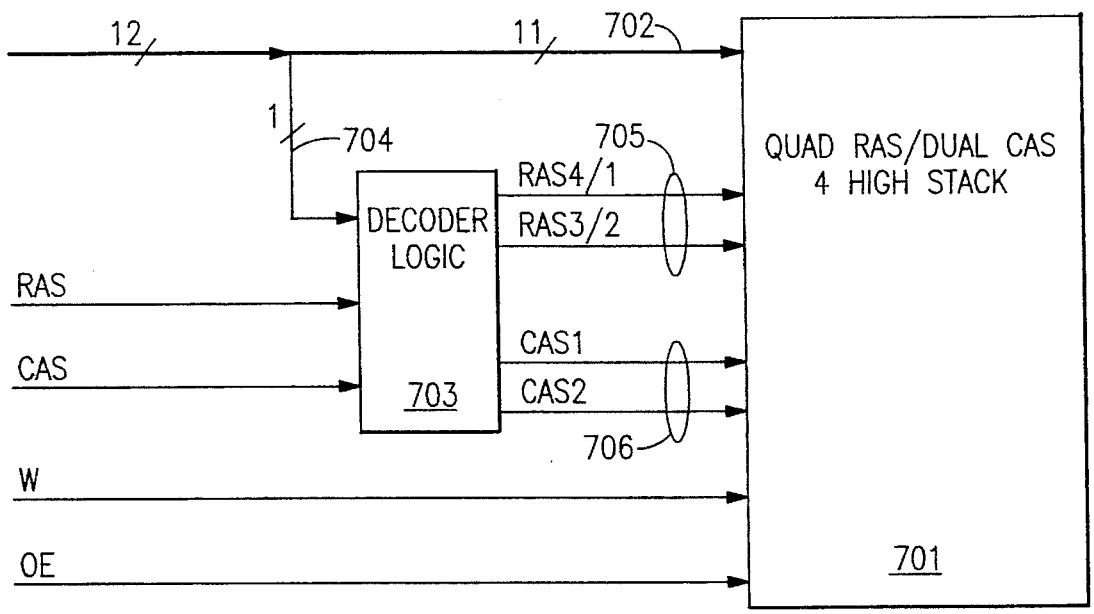
FIG. 7 shows a schematic overview of the emulation of a 16 Mb×4 bits 12/12 DRAM using a quad RAS, dual CAS four-high stack of 4 Mb×4 bits 11/11 DRAMs.
Figure 8:
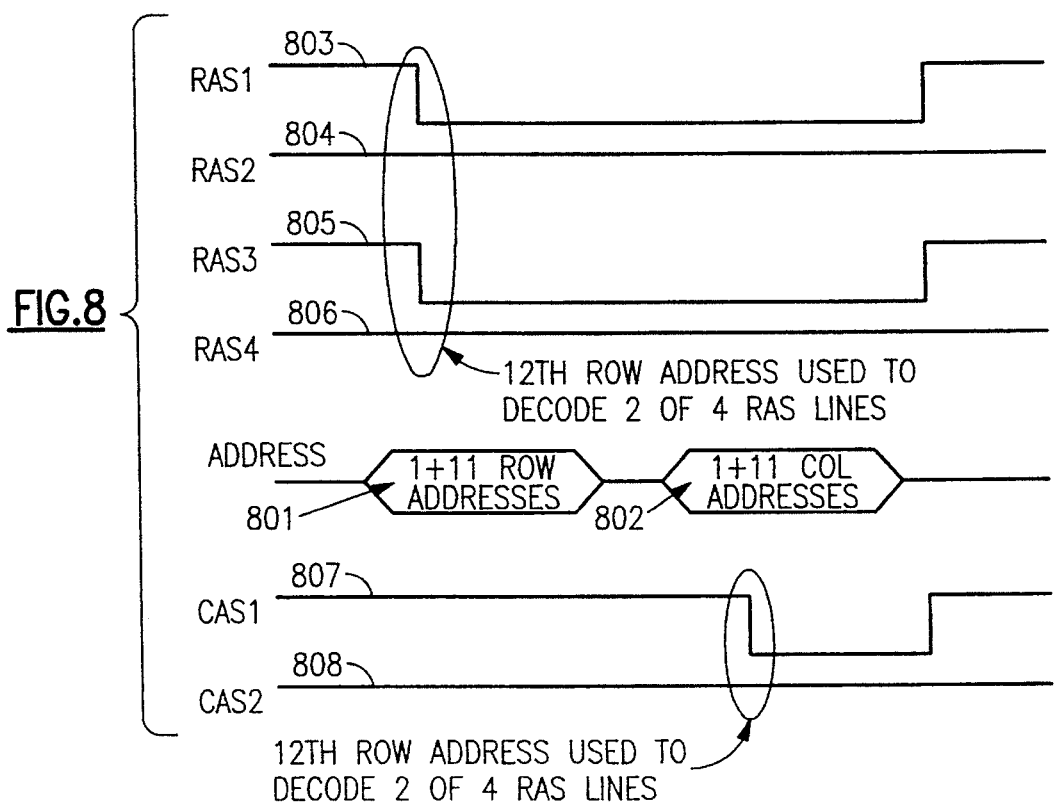
FIG. 8 shows a simple timing diagram illustrating the emulation of a 16 Mb×4 bits 12/12 DRAM with a quad RAS, dual CAS four-high stack of 4 Mb×4 bits 11/11 DRAMs.

FIG. 7 illustrates an overview of the aforementioned emulation of a 16 Mb×4 bits DRAM with 12/12 addressing using a quad RAS, dual CAS component including four 4 Mb×4 bits DRAMs with 11/11 addressing (701). Row address signal and column address signals are multiplexed over the address line (702). When the row address signal is generated, the decoder (703) takes the extra row address bit (704) from the address signal (702) and decodes it to direct the RAS over two of the four RAS lines (705) during the RAS transition time. When the extra column address bit (704) becomes available, it is decoded to direct the CAS over one of the two CAS lines (706). FIG. 8 illustrates a simplified timing diagram for the emulation scheme. The additional row address bit (801) permits the selective activation of two of the four RAS lines (803 and 805). The additional column address bit (802) permits the activation of one of the two CAS lines (807), the coincidence of a directed RAS and CAS pair will activate only one of the four DRAMs within the component as illustrated in FIG. 5.

Figure 9:
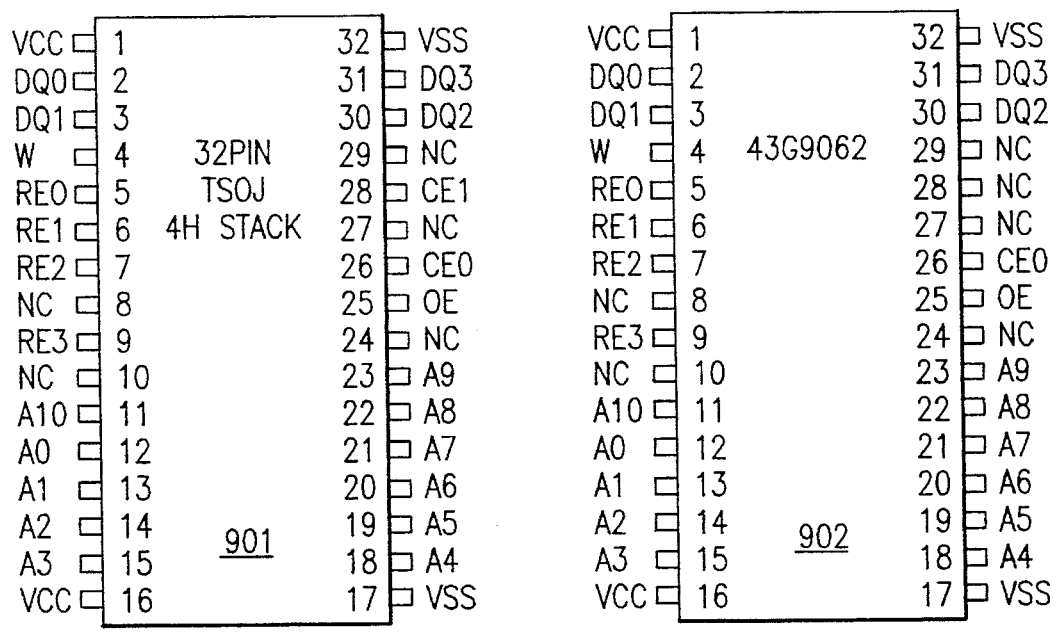
FIG. 9 illustrates the compatibility between a proposed pinout for the quad RAS, dual CAS component and IBM part number 43G9062.
Figure 10:
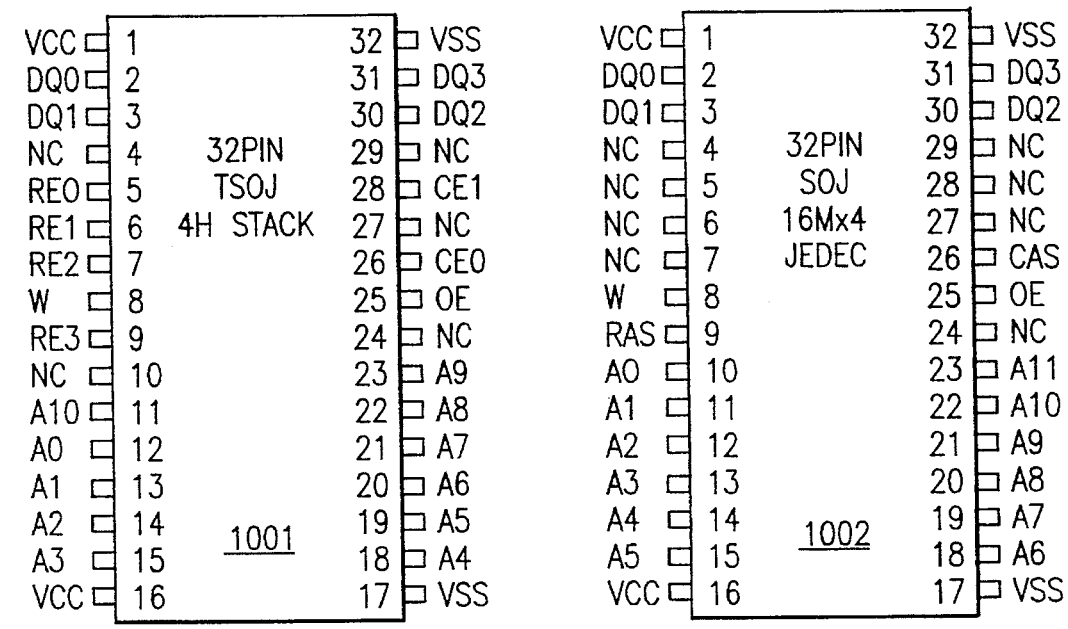
FIG. 10 illustrates the compatibility between a proposed pinout for the quad RAS, dual CAS component and the proposed JEDEC package for the 16 Mb×4 bits 12/12 component.

FIG. 9 shows an embodiment of the quad RAS, dual CAS component of four stacked 4 Mb×4 bits 11/11 DRAMs described herein (901). As illustrated this component has a pinout that is compatible with the pinout of the stacked 4 Mb×4 bits 11/11 DRAM component currently available from IBM Corporation as IBM part number 43G9062 (902). As illustrated in FIG. 9, the embodiment utilizes a second CAS line (CE1) on pin 28 which is not connected (or a no connect (NC) pin) on the currently available device. The package for both components would be a TSOJ-32 (400 mil×825 mil). FIG. 10 illustrates the compatibility between another embodiment of the stacked component (1001) and the 64 Mb 16 Mb×4 bits 12/12 DRAM (1002) as described in the JEDEC 16 Mb×4 bits DRAM standard incorporated herein by reference. As illustrated in FIG. 10, the embodiment utilizes pins 5–7 as RAS enable pins (RE0–RE2), and pin 9 as RE3 and is pinout compatible with the JEDEC component in which pins 5–7 are no connects and pin 9 is a RAS input. The same type of pinout compatibility exists between these two components for CAS enable and address pins as is evident by reference to FIG. 10. The remaining pins on these two components have identical pin assignments. The JEDEC specification provides that the component will be available in an SOJ-32 (400 mil×825 mil) package identical to the 400 mil×825 mil dimensions of the embodiment. Thus, the device has the same footprint as the next generation device. The advantages of having the same footprint and pin assignments compatible with the next generation DRAM device include:

1. A common board can be designed for both the current generation stacked component and next generation component.
2. Emulation of the next generation DRAM is possible within the same square area of the card.

Alternative Preferred Embodiments

Figure 11:
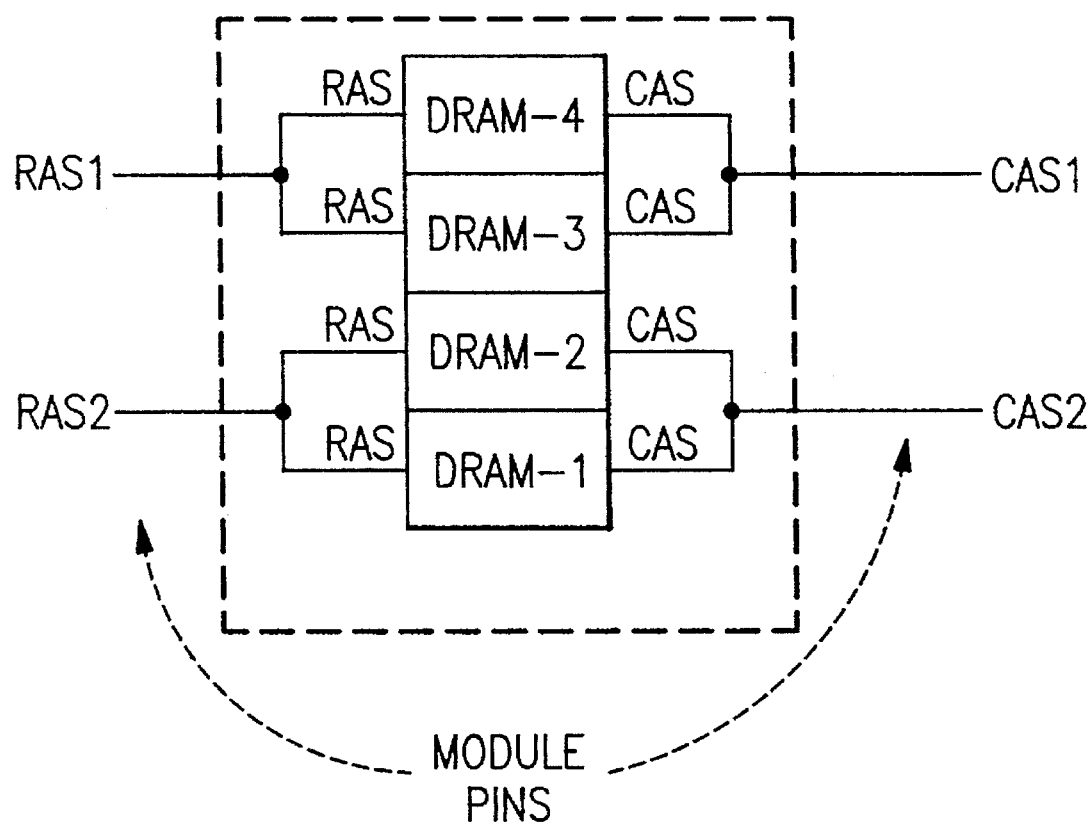
FIG. 11 shows a alternate embodiment of the quad RAS component in which only two RAS pins are available at the package level.

FIG. 11 shows a stacked component with two RAS pins. In such an embodiment rather than creating a quad RAS component, only two RAS lines are available as pins on the stacked component with each of these pins being connected to two of the stacked DRAM devices in the multiple DRAM component. The connections at the device level are such that the coincidence of directed RAS and CAS permit the selective activation of one of the stacked device as previously described. This modification would not effect the ability to emulate a 16 Mb×4 bits 12/12 DRAM, but it does take away some of the flexibility of the part when used for other applications. Alternatively, a single RAS quad CAS stacked component could be utilized wherein the stacked components are 4 Mb×4 bits 12/10 DRAMs. The RAS signal would not be directed via the decoding logic and would be provided to a single pin which connects to each of the stacked DRAMs within the component. Emulation of the 16 Mb×4 bits 12/12 DRAM would be achieved by decoding the two additional column address bits to provide a directed CAS signal over one of the four CAS lines from the decoding logic to only one of the four stacked DRAMs. It is further contemplated herein that multiple stacked components may be connected either logically or physically to achieve emulation of still higher storage capacity devices.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. An apparatus for emulating a first DRAM component having a first storage capacity, said first DRAM component being accessed by receiving an address signal from a controller, together with DRAM control signals, said address signal including a first number of address bits, said apparatus comprising:

an integrated circuit component including a plurality of second DRAMs, each of said plurality of second DRAMs having a second storage capacity, lower than the first storage capacity, wherein the cumulative total of said second storage capacities for said plurality of second DRAMs is at least equal to said first storage capacity, and wherein each of said plurality of second DRAMs may be accessed by receiving a second number of address bits from said address signal from said controller together with said DRAM control signals, said second number of address bits being less than said first number of address bits, each of said plurality of second DRAMs including a plurality of inputs for receiving said second number of address bits from said address signal and for receiving said DRAM control signals; and a decoder having at least one first input for receiving a number of decode bits from said address signal, said number of decode bits being equal to the difference between the first number of address bits and the second number of address bits, said decoder further having at least one second input for receiving at least one of said DRAM control signals, said decoder decoding said number of decode bits to direct the output of said at least one DRAM control signal, and selecting one of said plurality of second DRAMs by providing at least one directed DRAM control signal to at least one of said plurality of second DRAMs to permit access to one of said plurality of second DRAMs, each of said plurality of second DRAMs further having at least one input for receiving said at least one directed DRAM control signal.

2. The apparatus according to claim 1 wherein said first number of address bits includes a first row address and a first column address and wherein said first row address and said first column address are multiplexed over an address bus to said first DRAM component, and wherein said second number of address bits for said plurality of second DRAMs includes a second row address and a second column address and wherein said second row address and said second column address are multiplexed over said address bus to said integrated circuit component including said plurality of second DRAMs.

3. The apparatus according to claim 2 wherein said at least one DRAM control signal includes a row address strobe, and wherein said at least one directed DRAM control signal includes a directed row address strobe, and wherein said decoder is coupled to said at least one input for receiving said at least one directed DRAM control signal to provide the directed row address strobe to only one of said plurality of second DRAMs.

4. The apparatus according to claim 2 wherein said at least one DRAM control signal includes a column address strobe, and wherein said at least one directed DRAM control signal includes a directed column address strobe, and wherein said decoder is coupled to said at least one input for receiving said at least one directed DRAM control signal to provide the directed column address strobe to only one of said plurality of second DRAMs.

5. The apparatus according to claim 2 wherein said at least one DRAM control signal includes a row address strobe and a column address strobe, and wherein said at least one directed DRAM control signal includes a directed row address strobe and a directed column address strobe, and wherein said decoder is coupled to said at least one input for receiving said at least one directed DRAM control signal to provide the combination of the directed row address strobe and the directed column address strobe to only one of said plurality of second DRAMs.

6. The apparatus according to claim 2 wherein said first row address includes a first number of row address bits and said second row address includes a second number of row address bits and wherein said first number of row address bits is greater than said second number of row address bits.

7. The apparatus according to claim 2 wherein said first column address includes a first number of column address bits and wherein said second column address includes a second number of column address bits and wherein said first number of column address bits is greater than said second number of column address bits.

8. The apparatus according to claim 2 wherein said first row address includes a first number of row address bits and said second row address includes a second number of row address bits and wherein said first number of row address bits is greater than said second number of row address bits and wherein said first column address includes a first number of column address bits and wherein said second column address includes a second number of column address bits and wherein said first number of column address bits is greater than said second number of column address bits.

9. The apparatus according to claim 8 wherein the first number of row address bits is equal to the first number of column address bits and the second number of row address bits is equal to the second number of column address bits.

10. The apparatus according to claim 2 wherein said first DRAM component is a 16 Megabits by 4 bits DRAM and wherein said first row address has a length of twelve bits, and wherein said first column address has a length of twelve bits.

11. The apparatus according to claim 10 wherein said integrated circuit component includes four of said second DRAMs, and wherein each of said second DRAMs is a 4 Megabits by 4 bits DRAM and wherein said second row address has a length of eleven bits and wherein said second column address has a length of eleven bits.

12. The apparatus according to claim 5 wherein said integrated circuit component further includes a package housing said plurality of second DRAMs, and wherein said package further includes a first plurality of pins extending therefrom, at least one of said pins receiving said directed row address strobe and at least one of said pins receiving said directed column address strobe, and a second plurality within said first plurality of pins receiving said second row address and said second column address.

13. The apparatus according to claim 12 wherein four of said first plurality of pins may receive said directed row address strobe, and wherein each of said four pins connects to a different one of said plurality of second DRAMs for providing the directed row address strobe signal thereto, and wherein two of said first plurality of pins may receive said directed column address strobe, and wherein each of said two pins connects to a different pair of said plurality of second DRAMs for providing the directed column address strobe thereto, each of said four pins and said two pins connected to said plurality of second DRAMs to provide a unique combination of said directed row address strobe and said directed column address strobe to each of said plurality of second DRAMs, and wherein eleven of said second plurality of pins receive said second row address and said eleven pins additionally receive said second column address.

14. The apparatus according to claim 13 wherein said directed row address strobe is provided to two of said four pins, and wherein said directed row address strobe is provided by said two of said four pins to two of said plurality of second DRAMs, and wherein said directed column address strobe is provided to one of said two pins for receiving the directed column address strobe, and wherein said directed column address strobe is provided by said one of said two pins for receiving the directed column address strobe to two of said plurality of second DRAMs, and wherein said connections of said two pins for receiving said directed column address strobe and said four pins for receiving said directed row address strobe to said plurality of second DRAMs are configured to minimize the maximum delta I noise in the integrated circuit component.

15. The apparatus according to claim 1 wherein said integrated circuit component further includes a package housing said plurality of second DRAMs, and wherein said package has a physical footprint that is identical to a physical footprint for said first DRAM component, and wherein said package further includes a plurality of pins extending therefrom, and wherein the connections of said plurality of pins to said package are identical to pin connections for a plurality of pins connected to said first DRAM component, and wherein said plurality of pins connected to said package housing said plurality of second DRAMs have pin assignments that are compatible with said plurality of pins connected to said first DRAM component to permit said integrated circuit component including said plurality of second DRAMs and said first DRAM component to be used interchangeably on a circuit board without requiring any wiring changes on the circuit board.

16. The apparatus according to claim 15 wherein said package for said first DRAM component and said package for said integrated circuit component both have thirty two pins extending therefrom.

17. The apparatus according to claim 16 wherein said first DRAM component uses pin ten through pin fifteen and pin eighteen through pin twenty three for recieving said first address signal and wherein said integrated circuit component uses pin eleven through pin fifteen and pin eighteen through pin twenty three for receiving said second address signal and uses pin ten as a no connect, and wherein said first DRAM component uses pin nine for receiving said row address strobe and uses pin five through pin seven and pin twenty eight as no connects and uses pin twenty six for receiving said column address strobe, and wherein said integrated circuit component uses pins five through seven and pin nine for each receiving a different directed row address strobe from said decoder and uses pin twenty six and pin twenty eight for each receiving a different directed column address strobe from said decoder, and wherein the remaining pins for said first DRAM component and said integrated circuit component have identical pin assignments.

18. A method for emulating a first DRAM component having a first storage capacity wherein said first DRAM component may be accessed by receiving an address signal from a controller together with DRAM control signals, said address signal including a first number of address bits, with an integrated circuit component including a plurality of second DRAMs, each of said plurality of second DRAMs having a second storage capacity lower than said first storage capacity, wherein the cumulative total of said second storage capacities for said plurality of second DRAMs is at least equal to the first storage capacity, and with a decoder, the method comprising the steps of:

receiving a second number of address bits from said address signal from said controller into said integrated circuit component, said second number of address bits being less than said first number of address bits;

receiving a number of decode bits from said address signal into said decoder, said number of decode bits being equal to the difference between the first number of address bits and the second number of address bits;

receiving at least one of said DRAM control signals into said decoder; decoding said number of decode bits received by said decoder to direct the output of said received at least one DRAM control signal from said decoder;

outputting at least one directed DRAM control signal from said decoder for input into said integrated circuit component;

selectively accessing one of said plurality of second DRAMs within said integrated circuit component by providing said second number of address bits and said at least one directed DRAM control signal thereto.

19. The method according to claim 18 wherein said first number of address bits includes a first row address and a first column address and wherein said first row address and said first column address are multiplexed over an address bus, and wherein said second number of address bits include a second row address and a second column address and wherein the step of receiving said second number of address bits from said address signal from said controller into said integrated circuit component further includes the step of multiplexing said second row address and said second column address over said address bus to said integrated circuit component including said plurality of second DRAMs.

20. The method according to claim 18 wherein said at least one DRAM control signal includes a row address strobe, and wherein said at least one directed DRAM control signal includes a directed row address strobe and wherein said directed row address strobe is only provided to one of said plurality of second DRAMs included in said integrated circuit component.

21. The method according to claim 18 wherein said at least one DRAM control signal includes a column address strobe, and wherein said at least one directed DRAM control signal includes a directed column address strobe and wherein said directed column address strobe is only provided to one of said plurality of second DRAMs included in said integrated circuit component.

22. The method according to claim 18 wherein said at least one DRAM control signal includes a row address strobe and a column address strobe and wherein said at least one directed DRAM control signal includes a directed row address strobe and a directed column address strobe and wherein the combination of the directed row address strobe and the directed column address strobe is only provided to one of said plurality of second DRAMs included in said integrated circuit component.

23. The method according to claim 19 wherein said first row address includes a first number of row address bits and said second row address includes a second number of row address bits and wherein said first number of row address bits is greater than said second number of row address bits.

24. The method according to claim 19 wherein said first column address includes a first number of column address bits and wherein said second column address includes a second number of column address bits and wherein said first number of column address bits is greater than said second number of column address bits.

25. The method according to claim 19 wherein said first row address includes a first number of row address bits and said second row address includes a second number of row address bits and wherein said first number of row address bits is greater than said second number of row address bits and wherein said first column address includes a first number of column address bits and wherein said second column address includes a second number of column address bits and wherein said first number of column address bits is greater than said second number of column address bits.

26. The method according to claim 25 wherein the first number of row address bits is equal to the first number of column address bits and the second number of row address bits is equal to the second number of column address bits.

27. The method according to claim 19 wherein said first DRAM component is a 16 Megabits by 4 bits DRAM and wherein said first row address has a length of twelve bits, and wherein said first column address has a length of twelve bits.

28. The method according to claim 19 wherein said integrated circuit component includes four of said second DRAMs, and wherein each of said second DRAMs is a 4 Megabits by 4 bits DRAM and wherein said second row address has a length of eleven bits and wherein said second column address has a length of eleven bits.

29. The method according to claim 22 wherein said integrated circuit component further includes a package housing said plurality of second DRAMs, and wherein said package further includes a first plurality of pins extending therefrom, at least one of said pins for receiving said directed row address strobe and at least one of said pins for receiving said directed column address strobe, and a second plurality of pins within said first plurality of pins for receiving said second row address and said second column address.

30. The method according to claim 29 wherein four of said first plurality of pins may receive said directed row address strobe, and wherein each of said four pins connects to a different one of said plurality of second DRAMs for providing the directed row address strobe signal thereto, and wherein two of said first plurality of pins may receive said directed column address strobe, and wherein each of said two pins connects to a different pair of said plurality of second DRAMs for providing the directed column address strobe thereto, each of said four pins and said two pins connected to said plurality of second DRAMs to provide a unique combination of said directed row address strobe and said directed column address strobe to each of said plurality of second DRAMs, and wherein eleven of said second plurality of pins receive said second row address and said eleven pins additionally receive said second column address.

31. The method according to claim 30 wherein said directed row address strobe is provided to two of said four pins, and wherein said directed row address strobe is provided by said two of said four pins to two of said plurality of second DRAMs, and wherein said directed column address strobe is provided to one of said two pins for receiving the directed column address strobe, and wherein said directed column address strobe is provided by said one of said two pins for receiving the directed column address strobe to two of said plurality of second DRAMs, and wherein said connections of said two pins for receiving said directed column address strobe and said four pins for receiving said directed row address strobe to said plurality of second DRAMs are configured to minimize the maximum delta I noise in the integrated circuit component.

32. The method according to claim 18 wherein said integrated circuit component further includes a package housing said plurality of second DRAMs, and wherein said package has a physical footprint that is identical to a physical footprint for said first DRAM component, and wherein said package further includes a plurality of pins extending therefrom, and wherein the connections of said plurality of pins to said package are identical to pin connections for a plurality of pins connected to said first DRAM component, and wherein said plurality of pins connected to said package housing said plurality of second DRAMs have pin assignments that are compatible with said plurality of pins connected to said first DRAM component to permit said integrated circuit component including said plurality of second DRAMs or said first DRAM component to be used interchangeably on a circuit board without requiring any wiring changes on the circuit board.

* * * * *